United States Patent
Kim et al.

(10) Patent No.: US 12,210,777 B2
(45) Date of Patent: Jan. 28, 2025

(54) MEMORY DEVICE, OPERATING METHOD OF THE MEMORY DEVICE, AND MEMORY SYSTEM INCLUDING THE SAME

(71) Applicant: SAMSUNG ELECTRONICS CO., LTD., Suwon-si (KR)

(72) Inventors: Kyungmin Kim, Suwon-si (KR); Byongmo Moon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/242,250

(22) Filed: Sep. 5, 2023

(65) Prior Publication Data

US 2024/0078043 A1    Mar. 7, 2024

(30) Foreign Application Priority Data

Sep. 5, 2022 (KR) .................. 10-2022-0112339
Jun. 7, 2023 (KR) .................. 10-2023-0073135

(51) Int. Cl.
*G06F 3/06* (2006.01)

(52) U.S. Cl.
CPC .......... *G06F 3/0659* (2013.01); *G06F 3/0611* (2013.01); *G06F 3/0653* (2013.01); *G06F 3/0673* (2013.01)

(58) Field of Classification Search
CPC .... G06F 3/0659; G06F 3/0611; G06F 3/0653; G06F 3/0673; G11C 5/147; G11C 7/1093; G11C 7/222; G11C 11/4074; G11C 11/4096; G11C 29/023; G11C 29/028; G11C 7/04
See application file for complete search history.

(56) References Cited

U.S. PATENT DOCUMENTS 7,936,203 B2    5/2011   Zimlich
8,545,095 B2    10/2013  Chu
9,275,178 B1 *  3/2016   Fung .................. G06F 30/3312
(Continued)

FOREIGN PATENT DOCUMENTS

KR    10-2014-0041207 A    4/2014
KR    10-1931419 B1        12/2018

*Primary Examiner* — Charles Rones
*Assistant Examiner* — Jonah C Krieger
(74) *Attorney, Agent, or Firm* — Sughrue Mion, PLLC

(57) ABSTRACT

In some embodiments, a memory device includes a data sampler configured to sample a data signal based on a write data strobe signal, a measuring circuit configured to measure a temperature-based delay variation and a voltage-based delay variation of a transfer path of the write data strobe signal, a storage circuit configured to store a first coefficient code regulating a reference-based delay variation on the transfer path, a temperature sensor configured to sense the temperature of the transfer path, a monitoring circuit configured to generate a second coefficient code by comparing the sensed temperature, the temperature-based delay variation, the voltage-based delay variation, and the reference-based delay variation with each other, a reference voltage generator configured to generate a reference voltage, a voltage regulator configured to generate a regulation voltage, and a write data strobe signal transfer circuit configured to transfer the write data strobe signal to the data sampler.

20 Claims, 11 Drawing Sheets

(56) References Cited

U.S. PATENT DOCUMENTS

| | | |
|---|---|---|
| 9,384,819 B2 | 7/2016 | Takai |
| 9,658,642 B2 | 5/2017 | Mozak |
| 11,233,511 B2 | 1/2022 | Seo et al. |
| 2008/0288197 A1* | 11/2008 | Singh ................. G01R 31/2874 702/79 |
| 2015/0155039 A1 | 6/2015 | Tran et al. |
| 2022/0075564 A1 | 3/2022 | Moon et al. |

* cited by examiner

FIG. 7

| TEMPERATURE CODE | COEFFICIENT CODE |
|---|---|
| TCODE1 | CCODE1 |
| TCODE2 | CCODE2 |
| ⋮ | ⋮ |
| TCODEn | CCODEn |

MEMORY DEVICE, OPERATING METHOD OF THE MEMORY DEVICE, AND MEMORY SYSTEM INCLUDING THE SAME

CROSS-REFERENCE TO RELATED APPLICATIONS

This application claims benefit of priority under 35 U.S.C. § 119 to Korean Patent Application No. 10-2022-0112339, filed on Sep. 5, 2022, and to Korean Patent Application No. 10-2023-0073135, filed on Jun. 7, 20203, in the Korean Intellectual Property Office, the disclosures of which are incorporated by reference herein in their entireties.

BACKGROUND

The present disclosure relates generally to a semiconductor device, and more particularly, to a memory device regulating a delay on a data clock path, an operating method of the memory device, and a memory system including the memory device.

Electronic devices, such as, but not limited to, smart phones, graphic accelerators, and artificial intelligence (AI) accelerators, may process data by using a memory device such as, but not limited to, dynamic random access memory (DRAM). Electronic devices may control an internal and/or external memory device through a memory controller. The memory controller may transmit various signals to the memory device in order to control the memory device.

The memory device and the memory controller may transmit and/or receive data using a data signal. The memory device may sample the data signal by using a data clock signal (and/or a write data strobe signal) provided by the memory controller. For example, the memory device may sample the data signal based on edge timing of the data clock signal. That is, the memory device may transfer the data clock signal to a circuit for sampling the data signal in order to sample the data signal based on the data clock signal. As another example, the memory controller may perform training on the data clock signal to compensate for a delay on a path for transferring the data clock signal, which may be referred to as a data clock path.

The delay on the data clock path may vary depending on a temperature change of the memory device. When the sampling timing varies depending on a delay change on the data clock path, a setup/hold (S/H) margin may be reduced. Consequently, the memory controller may perform retraining to compensate for the delay change due to the temperature change. Accordingly, the memory controller may regulate the delay on the data clock path. However, when retraining is performed, resources used for training may increase.

SUMMARY

Aspects of the present disclosure provide for a memory device that may regulate a delay on a data clock path according to a real-time temperature change without retraining by a memory controller, an operating method of the memory device, and a memory system including the same.

According to an aspect of the present disclosure, a memory device is provided. The memory device includes a data sampler configured to sample a data signal from a memory controller based on a write data strobe signal from the memory controller. The memory device further includes a measuring circuit configured to measure a temperature-based delay variation based on a temperature of a transfer path of the write data strobe signal, and to measure a voltage-based delay variation based on a voltage on the transfer path of the write data strobe signal. The memory device further includes a storage circuit configured to store a first coefficient code regulating a reference-based delay variation on the transfer path of the write data strobe signal based on a temperature change. The memory device further includes a temperature sensor configured to sense the temperature of the transfer path of the write data strobe signal. The memory device further includes a monitoring circuit configured to generate a second coefficient code by comparing the sensed temperature, the temperature-based delay variation, the voltage-based delay variation, and the reference-based delay variation with each other. The memory device further includes a reference voltage generator configured to generate a reference voltage from a power voltage based on the second coefficient code. The memory device further includes a voltage regulator configured to generate a regulation voltage based on the reference voltage. The memory device further includes a write data strobe signal transfer circuit configured to transfer the write data strobe signal to the data sampler by using the regulation voltage.

According to an aspect of the present disclosure, an operating method of a memory device is provided. The operating method includes sampling a data signal from a memory controller based on a write data strobe signal from the memory controller. The operating method further includes measuring a temperature-based delay variation based on a temperature of a transfer path of the write data strobe signal, and measuring a voltage-based delay variation based on a voltage on the transfer path of the write data strobe signal. The operating method further includes generating a reference-based delay variation based on a first coefficient code and a temperature change of the memory device. The operating method further includes generating a second coefficient code determined by comparing the temperature-based delay variation, the voltage-based delay variation, and the reference-based delay variation with each other. The operating method further includes sampling the data signal by regulating a delay on the transfer path of the write data strobe signal based on the temperature change of the memory device and the second coefficient code.

According to an aspect of the present disclosure, a memory system is provided. The memory system includes a memory device and a memory controller. The memory device is configured to monitor a temperature-based delay variation based on a temperature, a voltage-based delay variation based on a voltage, and a reference-based delay variation with respect to a write data strobe signal for sampling a data signal. The memory controller is configured to determine a first coefficient code for regulating the reference-based delay variation. The memory device is further configured to compare the temperature-based delay variation, the voltage-based delay variation, and the reference-based delay variation with each other, to regulate a delay on a transfer path of the write data strobe signal based on a temperature change of the memory device, and to sample the data signal.

Additional aspects may be set forth in part in the description which follows and, in part, may be apparent from the description, and/or may be learned by practice of the presented embodiments.

BRIEF DESCRIPTION OF THE DRAWINGS

The above and other aspects, features, and advantages of certain embodiments of the present disclosure may be more apparent from the following description taken in conjunction with the accompanying drawings, in which:

FIG. 7 is a table of an operation of a monitoring circuit of FIG. 3, according to an embodiment;

DETAILED DESCRIPTION OF THE EMBODIMENTS

Figure 1:
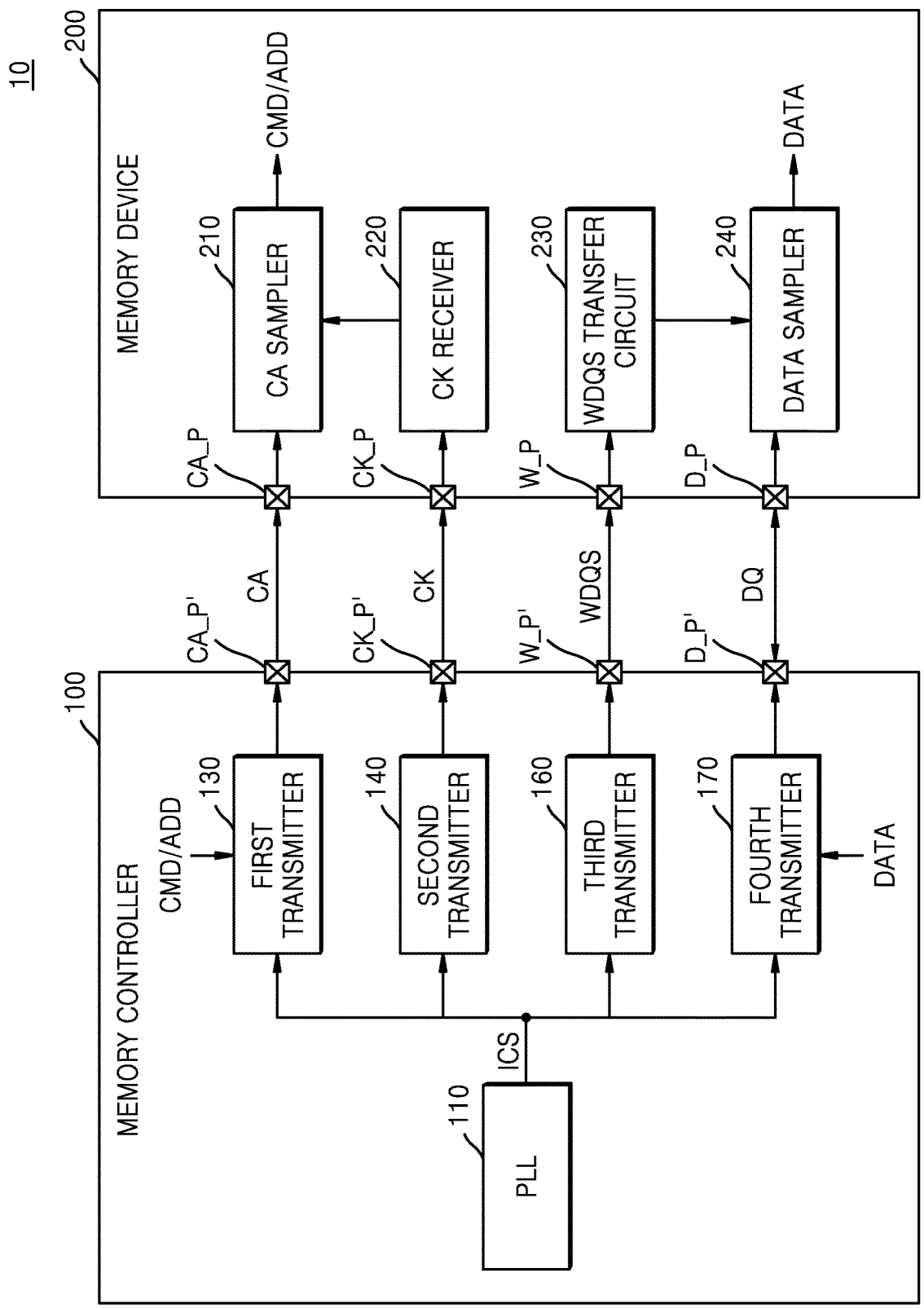
FIG. 1 is a block diagram illustrating a memory system, according to an embodiment.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art may recognize that various changes and modifications of the embodiments described herein may be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It is to be understood that when an element or layer is referred to as being "over," "above," "on," "below," "under," "beneath," "connected to" or "coupled to" another element or layer, it may be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", and the like may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", and the like may be used to distinguish components from each other and do not limit the present disclosure. For example, the terms "first", "second", "third", and the like may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

It is to be understood that the specific order or hierarchy of blocks in the processes/flowcharts disclosed are an illustration of exemplary approaches. Based upon design preferences, it is understood that the specific order or hierarchy of blocks in the processes/flowcharts may be rearranged. Further, some blocks may be combined or omitted. The accompanying claims present elements of the various blocks in a sample order, and are not meant to be limited to the specific order or hierarchy presented.

The embodiments herein may be described and illustrated in terms of blocks, as shown in the drawings, which carry out a described function or functions. These blocks, which may be referred to herein as units or modules or the like, or by names such as device, logic, circuit, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like, and may also be implemented by or driven by software and/or firmware (configured to perform the functions or operations described herein).

Hereinafter, various embodiments of the present disclosure are described with reference to the accompanying drawings.

FIG. 1 is a block diagram illustrating a memory system, according to an embodiment.

Referring to FIG. 1, a memory system 10 may include a memory controller 100 and a memory device 200. The memory controller 100 may control overall operations of the memory device 200. For example, the memory controller 100 may control the memory device 200 to output data DATA from the memory device 200. Alternatively or additionally, the memory controller 100 may control the memory device 200 to store the data DATA in the memory device 200.

The memory controller 100 may transmit various signals to the memory device 200 and/or receive various signals from the memory device 200. For example, the memory controller 100 may transmit a command/address signal CA, a clock signal CK, a write data strobe signal WDQS, and/or a data signal DQ to the memory device 200. Alternatively or additionally, the memory controller 100 may receive the data signal DQ from the memory device 200. The command/address signal CA may include a command CMD and/or an address ADD. The data signal DQ may include the data DATA.

In an embodiment, the memory controller 100 may be implemented in a host and may access the memory device 200 according to a request of a processor included with the host. For example, the memory controller 100 may access the memory device 200 in a direct memory access (DMA) method. As another example, the memory controller 100 may be implemented as a part of a system-on-chip (SoC), but the present disclosure is not limited thereto.

The memory device 200 may operate as at least one of a buffer memory, a working memory, and a main memory for a host including the memory controller 100. That is, the memory device 200 may operate under the control of the memory controller 100. For example, the memory device 200 may output the stored data DATA under the control of the memory controller 100. As another example, the memory device 200 may store the data DATA provided by the memory controller 100.

The memory device 200 may receive various signals from the memory controller 100 and/or may transmit various signals to the memory controller 100. For example, the memory device 200 may receive the command/address signal CA, the clock signal CK, the write data strobe signal WDQS, and the data signal DQ from the memory controller 100. Alternatively or additionally, the memory device 200 may transmit the data signal DQ to the memory controller 100.

The memory controller 100 may include a phase locked loop (PLL) 110, a first transmitter 130, a second transmitter 140, a third transmitter 160, and a fourth transmitter 170. The PLL 110 may generate an internal clock signal ICS. For example, the internal clock signal ICS may have a specific frequency (e.g., a repeating period) and may toggle between a high level and a low level.

The first transmitter 130 may transmit the command/address signal CA to the memory device 200 based on the internal clock signal ICS. For example, the first transmitter 130 may transmit the command CMD and/or the address ADD to the memory device 200 through the command/address signal CA at the timing of a rising edge and/or a falling edge of the internal clock signal ICS. The command/address signal CA may be transmitted to the memory device 200 through a command/address pin CA_P'.

The second transmitter 140 may transmit the internal clock signal ICS to the memory device 200 as the clock signal CK. For example, the internal clock signal ICS and the clock signal CK may have a substantially similar and/or the same frequency and/or a substantially similar and/or the same phase. As another example, the second transmitter 140 may divide the internal clock signal ICS and transmit the divided internal clock signal dICS to the memory device 200 as the clock signal CK. In this example, the divided internal clock signal dICS and the clock signal CK may have a different frequency (e.g., a multiple) and/or a different phase. The clock signal CK may be transmitted to the memory device 200 through the clock pin CK_P'.

The third transmitter 160 may transmit the internal clock signal ICS to the memory device 200 as the write data strobe signal WDQS. For example, the internal clock signal ICS and the write data strobe signal WDQS may have a substantially similar and/or the same frequency and/or a substantially similar and/or the same phase. As another example, the third transmitter 160 may divide the internal clock signal ICS and transmit the divided internal clock signal dICS to the memory device 200 as the write data strobe signal WDQS. In this example, the divided internal clock signal dICS and the write data strobe signal WDQS may have a different frequency (e.g., a multiple) and/or a different phase. The write data strobe signal WDQS may be transmitted to the memory device 200 through a write data strobe pin W_P'.

The fourth transmitter 170 may transmit the data signal DQ to the memory device 200 based on the internal clock signal ICS. For example, the fourth transmitter 170 may transmit the data DATA to the memory device 200 through the data signal DQ at the timing of the rising edge and/or the falling edge of the internal clock signal ICS. The data signal DQ may be transmitted to the memory device 200 through a data pin D_P'.

As shown in FIG. 1, the clock signal CK and the write data strobe signal WDQS may be generated by the one PLL 110. Accordingly, an operating current of the memory controller 100 may be reduced. However, the present disclosure is not limited thereto, and each of the clock signal CK and the write data strobe signal WDQS may be generated by separate PLLs.

The memory device 200 may include a command/address (CA) sampler 210, a clock (CK) receiver 220, a write data strobe signal (WDQS) transfer circuit 230, and a data sampler 240.

The clock (CK) receiver 220 may receive the clock signal CK from the memory controller 100 through a clock pin CK_P. The clock signal CK received by the clock (CK) receiver 220 may be transmitted to the command/address (CA) sampler 210.

The command/address (CA) sampler 210 may receive the command/address signal CA from the memory controller 100 through a command/address pin CA_P. The command/address (CA) sampler 210 may sample the command/address signal CA based on the clock signal CK. For example, the command/address (CA) sampler 210 may sample the command/address signal CA at the timing of a rising edge and/or a falling edge of the clock signal CK. Accordingly, the memory device 200 may obtain the command and/or address CMD/ADD.

The write data strobe signal WDQS transfer circuit 230 may receive the write data strobe signal WDQS from the memory controller 100 through a write data strobe pin W_P. The WDQS transfer circuit 230 may transfer the write data strobe signal WDQS to the data sampler 240. In an embodiment, the WDQS transfer circuit 230 may include a WDQS receiver and a WDQS tree circuit. For example, the WDQS receiver may receive the write data strobe signal WDQS provided by the write data strobe pin W_P. The WDQS tree circuit may include a plurality of repeaters for transferring the write data strobe signal WDQS output from the WDQS receiver to the data sampler 240. For example, each of the plurality of repeaters may be implemented as at least one buffer or inverter.

The data sampler 240 may receive the data signal DQ from the memory controller 100 through a data pin D_P. The data sampler 240 may sample the data signal DQ based on the write data strobe signal WDQS. For example, the data sampler 240 may sample the data signal DQ at the timing of a rising edge and/or a falling edge of the write data strobe signal WDQS. Accordingly, the memory device 200 may obtain the data DATA.

In an embodiment, the memory device 200 may sample the data signal DQ based on the write data strobe signal WDQS that may be different from the clock signal CK. That is, the write data strobe signal WDQS may be a clock signal for data communication (e.g., a data clock signal).

In an embodiment, a path through which the write data strobe signal WDQS is transferred from the write data strobe pin W_P to the data sampler 240 (hereinafter referred to as a WDQS path WDQS_P) may not match a path through which the data signal DQ is transferred from the data pin D_P to the data sampler 240 (hereinafter referred to as a DQ path DQ_P). For example, circuits on the WDQS path WDQS_P and the DQ path DQ_P may be disposed asymmetrically. As another example, the number of transistors included in the WDQS path WDQS_P may be different from the number of transistors included in each of the DQ path DQ_P. Consequently, even though training may have been performed on the write data strobe signal WDQS during an initialization process of the memory device 200, a delay change on the WDQS path WDQS_P according to a temperature change and/or a delay change on the DQ path DQ_P may be different from each other. Accordingly, an arrival timing (e.g., a sampling timing) of the write data strobe signal WDQS transferred to the data sampler 240 may vary. For example, the delay change on the WDQS path WDQS_P according to the temperature change may vary depending on characteristics of devices on the WDQS path WDQS_P. Accordingly, the setup/hold (S/H) margin of the data sampler 240 may be reduced.

According to some embodiments, the delay change on the WDQS path WDQS_P according to the temperature change may be compensated for without retraining the write data strobe signal WDQS. For example, the memory device 200 may regulate the delay on the WDQS path WDQS_P according to the temperature change sensed in real time in consideration of characteristics of circuits on the WDQS path WDQS_P. Accordingly, the delay on the WDQS path WDQS_P based on training performed in the initialization process of the memory device 200 may be maintained. Consequently, the S/H margin of the data sampler 240 may be improved and data errors may be reduced regardless of the temperature change, when compared to a related memory device.

Figure 2:
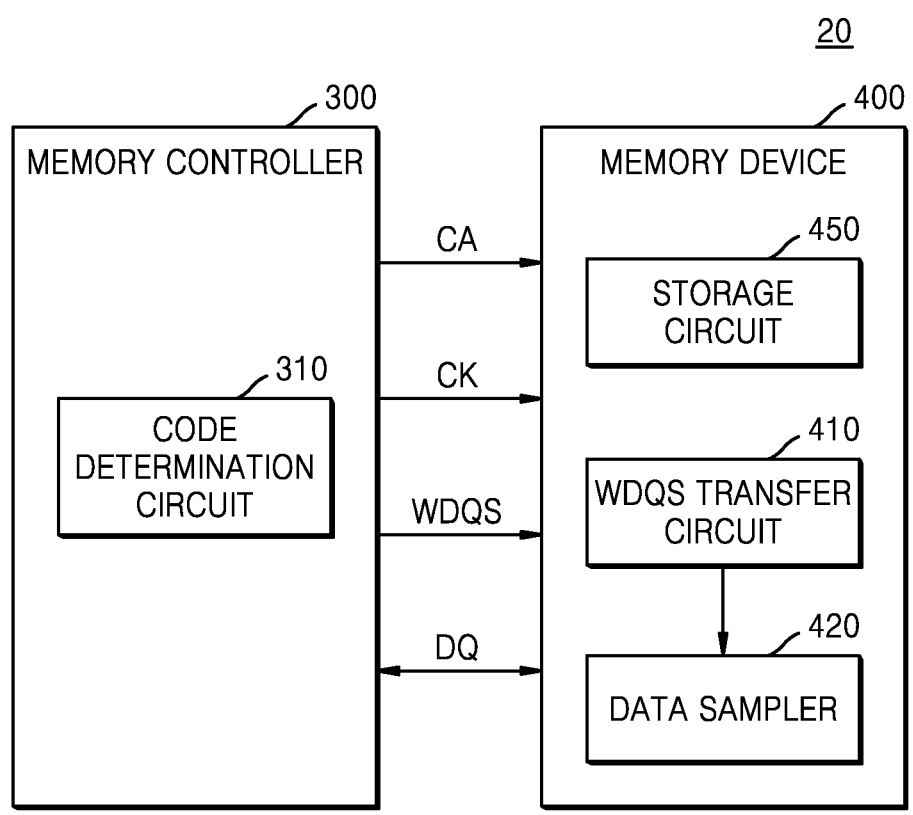
FIG. 2 is a block diagram illustrating a memory system, according to an embodiment.

FIG. 2 is a block diagram illustrating a memory system, according to an embodiment.

Referring to FIG. 2, a memory system 20 may include a memory controller 300 and a memory device 400. The memory controller 300 of FIG. 2 may include and/or may be similar in many respects to the memory controller 100 described above with reference to FIG. 1, and may include additional features not mentioned above. Furthermore, the memory device 400 of FIG. 2 may include and/or may be similar in many respects to the memory device 200 described above with reference to FIG. 1, and may include additional features not mentioned above. Consequently, repeated descriptions of the memory controller 300 and the memory device 400 described above with reference to FIG. 1 may be omitted for the sake of brevity.

The memory controller 300 may include a code determination circuit 310. The code determination circuit 310 may control an initialization operation and/or a test operation of the memory device 400. The code determination circuit 310 may determine a code in the initialization operation and/or the test operation of the memory device 400 and set the determined code in the memory device 400. As used herein, determining a code may refer to determining a coefficient code. For example, the coefficient code may include a negative temperature coefficient (NTC) and a positive temperature coefficient (PTC). A resistance value of the NTC may decrease when a temperature value increases. Alternatively or additionally, a resistance value of the PTC may increase when the temperature value increases. The coefficient code may regulate a low dropout (LDO) reference voltage variation according to a temperature variation. For example, the coefficient code may correspond to a delay regulation amount for regulating a delay on a WDQS path WDQS_P. In an embodiment, the coefficient code may be referred to as a delay code. When the delay on the WDQS path WDQS_P is regulated according to the coefficient code, the delay on the WDQS path WDQS_P may be maintained constant regardless of a temperature change. In an embodiment, the code determination circuit 310 may be implemented as a processor such as, but not limited to, a central processing unit (CPU) of the memory controller 300. However, the present disclosure is not limited thereto, and the code determination circuit 310 may be implemented in various forms without departing from the scope of the present disclosure. For example, the code determination circuit 310 may be implemented as an integrated circuit, as software, and/or a combination of circuits and software.

In an embodiment, the code determination circuit 310 may determine the coefficient code based on a previously determined temperature. Alternatively or additionally, the code determination circuit 310 may transfer the determined coefficient code to the memory device 400. For example, the code determination circuit 310 may determine the coefficient code based on information of the write data strobe signal WDQS with respect to temperature.

The memory device 400 may include a write data strobe signal (WDQS) transfer circuit 410, a data sampler 420, and a storage circuit 450. The WDQS transfer circuit 410 may transfer the write data strobe signal WDQS provided by the memory controller 300 to the data sampler 420. The data sampler 420 may sample the data signal DQ provided by the memory controller 300 based on the write data strobe signal WDQS.

The storage circuit 450 may store the coefficient code provided by the memory controller 300. In an embodiment, the storage circuit 450 may be implemented as a register and/or a fuse. For example, when a first code and a second code are set during the initialization process of the memory device 400, the storage circuit 450 may be and/or may include a mode register. As another example, when the coefficient code is set during the test process of the memory device 400, the storage circuit 450 may be and/or may include a test mode register and/or a fuse.

Figure 3:
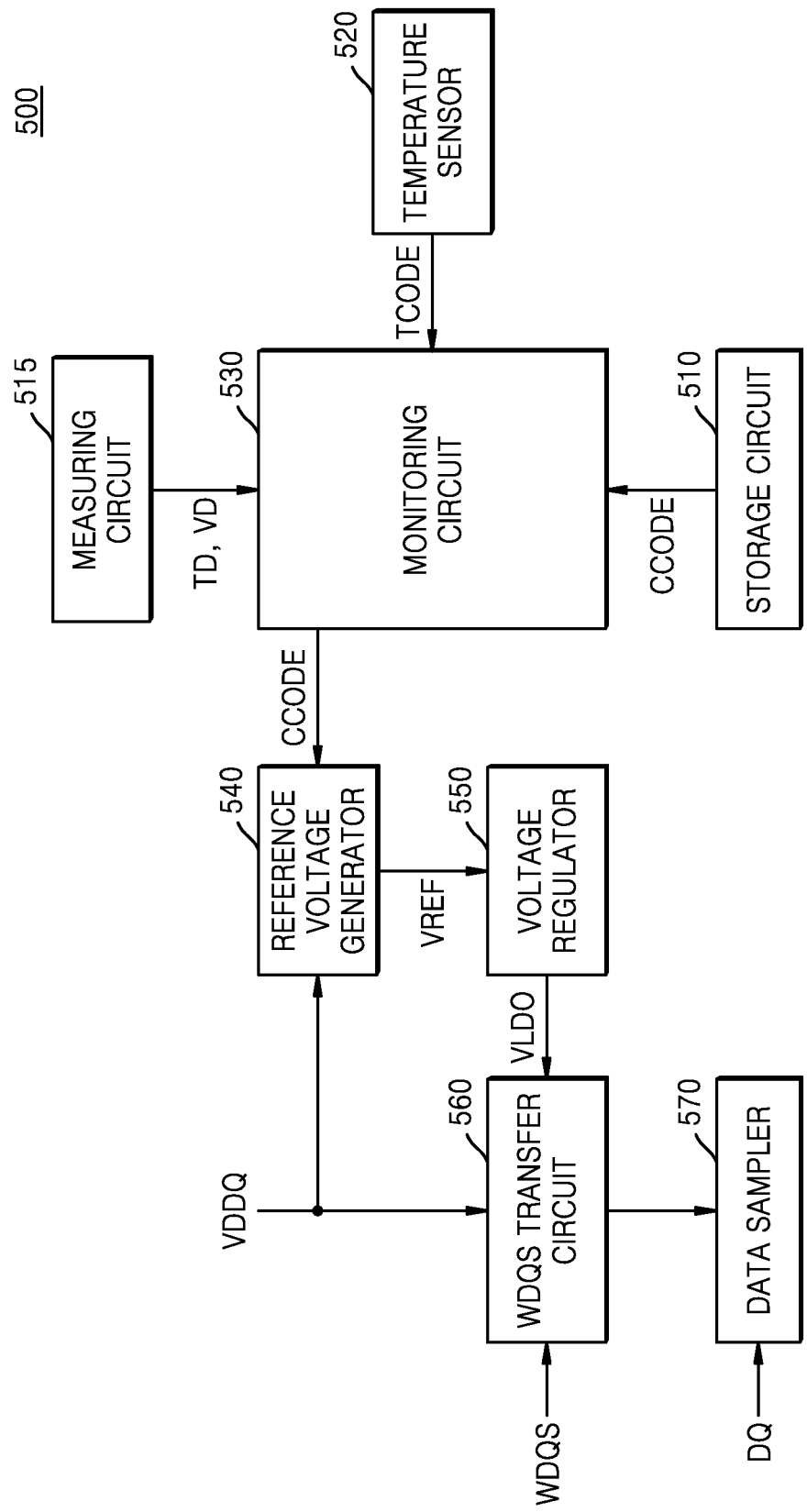
FIG. 3 is a block diagram illustrating a memory device for a delay regulation on a write data strobe signal WDQS path, according to an embodiment.

FIG. 3 is a block diagram illustrating a memory device for delay regulation on a WDQS path WDQS_P, according to an embodiment.

The memory device 500 of FIG. 3 may include and/or may be similar in many respects to at least one of the memory device 200 and the memory device 400 described above with reference to FIGS. 1 and 2, and may include additional features not mentioned above. Consequently, repeated descriptions of the memory device 500 described above with reference to FIGS. 1 and 2 may be omitted for the sake of brevity.

Referring to FIG. 3, the memory device 500 may include a storage circuit 510, a temperature sensor 520, a monitoring circuit 530, a reference voltage generator 540, a voltage regulator 550, a write data strobe signal (WDQS) transfer circuit 560, and a data sampler 570. The storage circuit 510 may include and/or may be similar in many respects to the storage circuit 450 of FIG. 2, and may include additional features not mentioned above. The WDQS transfer circuit 560 may include and/or may be similar in many respects to at least one of the WDQS transfer circuit 230 and the WDQS transfer circuit 410 described above with reference to FIGS. 1 and 2, and may include additional features not mentioned above. The data sampler 570 may include and/or may be similar in many to the data sampler 240 and the data sampler 420 described above with reference to FIGS. 1 and 2, and may include additional features not mentioned above. Consequently, repeated descriptions of the storage circuit 510, WDQS transfer circuit 560, and the data sampler 570 described above with reference to FIGS. 1 and 2 may be omitted for the sake of brevity.

The storage circuit 510 may store a coefficient code CCODE. As described with reference to FIGS. 1 and 2, the coefficient code CCODE may be determined by the memory controllers 100 and 300 during an initialization process and/or a test process. For example, the storage circuit 510 may be implemented as one at least one of a mode register, a test mode register, and a fuse.

A measuring circuit 515 may measure a temperature and a voltage on the WDQS path WDQS_P. For example, the measuring circuit 515 may measure a delay variation TD $$\left(\text{e.g.,}\ \frac{\Delta\,\text{delay time}}{\Delta temp}\right),$$

according to the temperature on the WDQS path WDQS_P. Alternatively or additionally, the measuring circuit 515 may measure a delay variation VD $$\left(\text{e.g.,}\ \frac{\Delta\,\text{delay time}}{\Delta\,\text{voltage}}\right),$$

according to the voltage on the WDQS path WDQS_P. The measuring circuit 515 may transfer the delay variation TD and the delay variation VD to the monitoring circuit 530.

The temperature sensor 520 may sense the temperature of the memory device 500. The temperature sensor 520 may provide a temperature code TCODE based on the sensed current temperature to the monitoring circuit 530.

The monitoring circuit 530 may monitor a delay variation TVD. The delay variation TVD $$\left(\text{e.g.,}\ \frac{\Delta V\_LDO\_REF}{\Delta temp}\right)$$

may refer to an LDO reference voltage variation $\Delta V\_LDO\_REF$ according to a temperature variation $\Delta temp$. That is, the delay variation TVD may be obtained by dividing the LDO reference voltage variation $\Delta V\_LDO\_REF$ by the temperature variation $\Delta temp$. The determined coefficient code CCODE may correspond to the delay regulation amount for regulating the delay on the WDQS path WDQS_P. For example, the monitoring circuit 530 may calculate a temperature change based on a previously determined reference temperature and the temperature code TCODE. Alternatively or additionally, the monitoring circuit 530 may compare the delay variation TD and the delay variation VD with the delay variation TVD. When a ratio obtained by dividing the delay variation TD by the delay variation VD is equal to a value obtained by multiplying the delay variation TVD by −1, the monitoring circuit 530 may output the determined coefficient code CCODE for regulating the delay. That is, the absolute value of the ratio of the delay variation TD and the delay variation VD may be substantially similar to and/or the same as the absolute value of the delay variation TVD but the sign (e.g., positive, negative) of the ratio of the delay variation TD and the delay variation VD and the sign of the delay variation TVD may be different. For example, when the delay on the WDQS path WDQS_P is regulated according to the determined coefficient code CCODE, the delay on the write data strobe signal WDQS path may be maintained constant regardless of the temperature change.

The reference voltage generator 540 may generate a reference voltage VREF from a power voltage VDDQ based on the determined coefficient code CCODE. The reference voltage generator 540 may generate the reference voltage VREF having a level corresponding to the determined coefficient code CCODE.

The voltage regulator 550 may generate a regulation voltage VLDO based on the reference voltage VREF. For example, the voltage regulator 550 may generate the regulation voltage VLDO having a lower level than the level of the reference voltage VREF. The regulation voltage VLDO output from the voltage regulator 550 may be provided to the WDQS transfer circuit 560.

The WDQS transfer circuit 560 may transfer the write data strobe signal WDQS to the data sampler 570. The WDQS transfer circuit 560 may transfer the write data strobe signal WDQS to the data sampler 570 by using the power voltage VDDQ and the regulation voltage VLDO. For example, some of the repeaters (or inverters) of the WDQS transfer circuit 560 may operate by using the power voltage VDDQ. Alternatively or additionally, the remaining repeaters (or inverters) of the WDQS transfer circuit 560 may operate by using the regulation voltage VLDO. In such an example, a delay of the write data strobe signal WDQS transferred through the repeaters operating using the regulation voltage VLDO may be controlled according to the level of the regulation voltage VLDO.

The data sampler 570 may sample the data signal DQ based on the write data strobe signal WDQS. When the delay on the WDQS path WDQS_P is regulated based on the regulation voltage VLDO, an S/H margin of the data sampler 570 may be improved regardless of the temperature. Accordingly, an error rate of data output from the data sampler 570 may be reduced.

In an embodiment, the memory device 500 may control a level of the regulation voltage VLDO applied to the WDQS transfer circuit 560 through the voltage regulator 550 based on the previously stored coefficient code CCODE, the delay variation TD, the delay variation VD, the delay variation TVD, and the temperature code TCODE. Accordingly, the memory device 500 may regulate the delay on the WDQS path WDQS_P according to the temperature sensed in real time without retraining by the memory controller (e.g., memory controller 100 of FIG. 1, memory controller 300 of FIG. 2).

Figure 4:
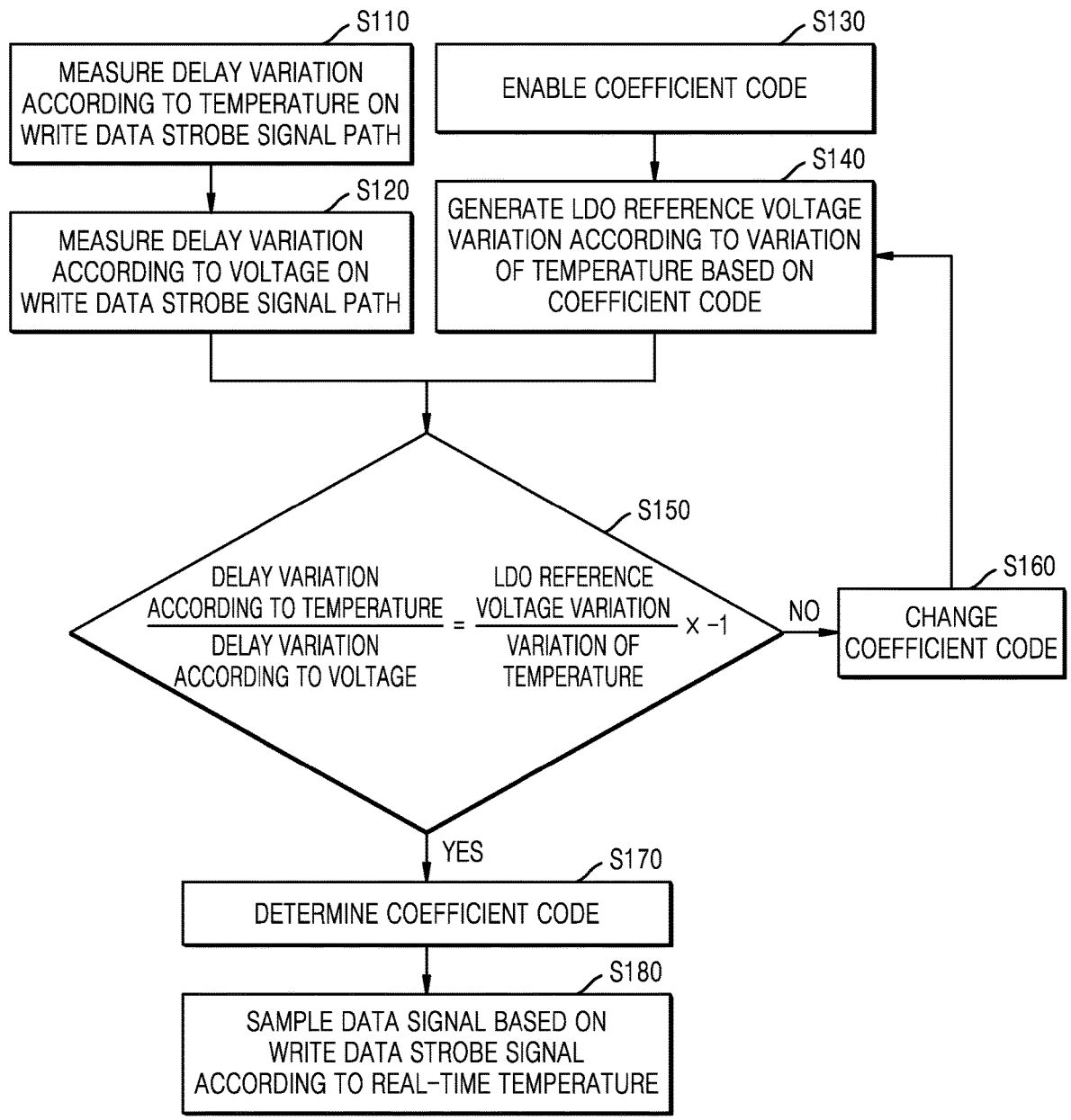
FIG. 4 is a flowchart illustrating a delay regulation operation of a memory system, according to an embodiment.

FIG. 4 is a flowchart illustrating a delay regulation operation according to a memory system, according to an embodiment.

That is, an operation in which the memory system regulates a delay on a WDQS path WDQS_P based on a temperature change is described with reference to FIG. 4.

Referring to FIGS. 3 and 4, in operation S110, the memory device 500 may measure the delay variation TD according to a temperature on the WDQS path WDQS_P. For example, the memory device 500 may measure the delay variation TD according to the temperature on the WDQS path WDQS_P using the measuring circuit 515.

In operation S120, the memory device 500 may measure the delay variation VD according to a voltage on the WDQS path WDQS_P. For example, the memory device 500 may measure the delay variation VD according to the voltage on the WDQS path WDQS_P using the measuring circuit 515.

Continuing to refer to FIGS. 2 to 4, in operation S130, the memory controller 300 may enable the coefficient code CCODE. For example, the memory controller 300 may enable the coefficient code CCODE using the code determination circuit 310. In an embodiment, the code determination circuit 310 may enable the coefficient code CCODE according to an enable command. The code determination circuit 310 may transfer the coefficient code CCODE to the memory device 400 when the coefficient code CCODE is enabled.

In operation S140, the memory device 500 may generate the delay variation TVD based on the coefficient code CCODE. For example, the memory device 500 may monitor the delay variation TVD based on the coefficient code CCODE using the monitoring circuit 530.

In operation S150, the memory device 500 may determine whether a ratio obtained by dividing the delay variation TD by the delay variation VD is equal to a value obtained by multiplying the delay variation TVD by −1.

When the ratio obtained by dividing the delay variation TD by the delay variation VD is not equal to the value obtained by multiplying the delay variation TVD by −1 (NO in operation S150), the memory device 500 may change the coefficient code CCODE in operation S160. For example, the memory controller 300 may change the coefficient code CCODE using the code determination circuit 310.

Alternatively or additionally, when the ratio obtained by dividing the delay variation TD by the delay variation VD is equal to the value obtained by multiplying the delay variation TVD by −1 (YES in operation S150), the memory device 500 may determine the coefficient code CCODE in operation S170. For example, the monitoring circuit 530 of the memory device 500 may output the determined coefficient code CCODE. The determined coefficient code CCODE may correspond to a delay regulation amount for regulating the delay on the WDQS path WDQS_P.

In operation S180, the memory device 500 may sample the data signal DQ based on the write data strobe signal WDQS according to the real-time temperature. In an embodiment, the write data strobe signal WDQS may be transferred to the data sampler 240 using the WDQS transfer circuit 230. In such an embodiment, the timing at which the write data strobe signal WDQS arrives at the data sampler 240 may be maintained constant regardless of a temperature change of the memory device 200. That is, a value of the voltage on the WDQS path WDQS_P may be regulated according to the temperature change on the WDQS path WDQS_P by using a value of the delay variation TVD determined in operation S150. When a temperature t1 on the WDQS path WDQS_P monitored at a first time and a temperature t2 on the WDQS path WDQS_P monitored at a second time after the first time point are different from each other, the voltage on the WDQS path WDQS_P may be increased by a value obtained by multiplying a difference between the temperature t2 and the temperature t1 by the delay variation TVD. That is, a voltage v2 on the WDQS path WDQS_P at the second time may be determined to be equal to a result obtained by adding the value obtained by multiplying the difference between the temperature t2 and the temperature t1 by the delay variation TVD to a voltage v1 on the WDQS path WDQS_P at the first time (e.g., v2=v1+TVD×(t2−t1)). The data sampler 240 may sample the data signal DQ based on the write data strobe signal WDQS.

According to the memory system 10 of the present disclosure, the memory device 200 may compensate for a delay change on the WDQS path WDQS_P according to the real-time temperature change based on the coefficient code CCODE determined during an initialization process or a test process. That is, the delay on the WDQS path WDQS_P may be maintained constant without retraining by the memory controller 100. Accordingly, retraining may not need to be performed to compensate for a delay change on the WDQS path WDQS_P due to the temperature change.

Figure 5:
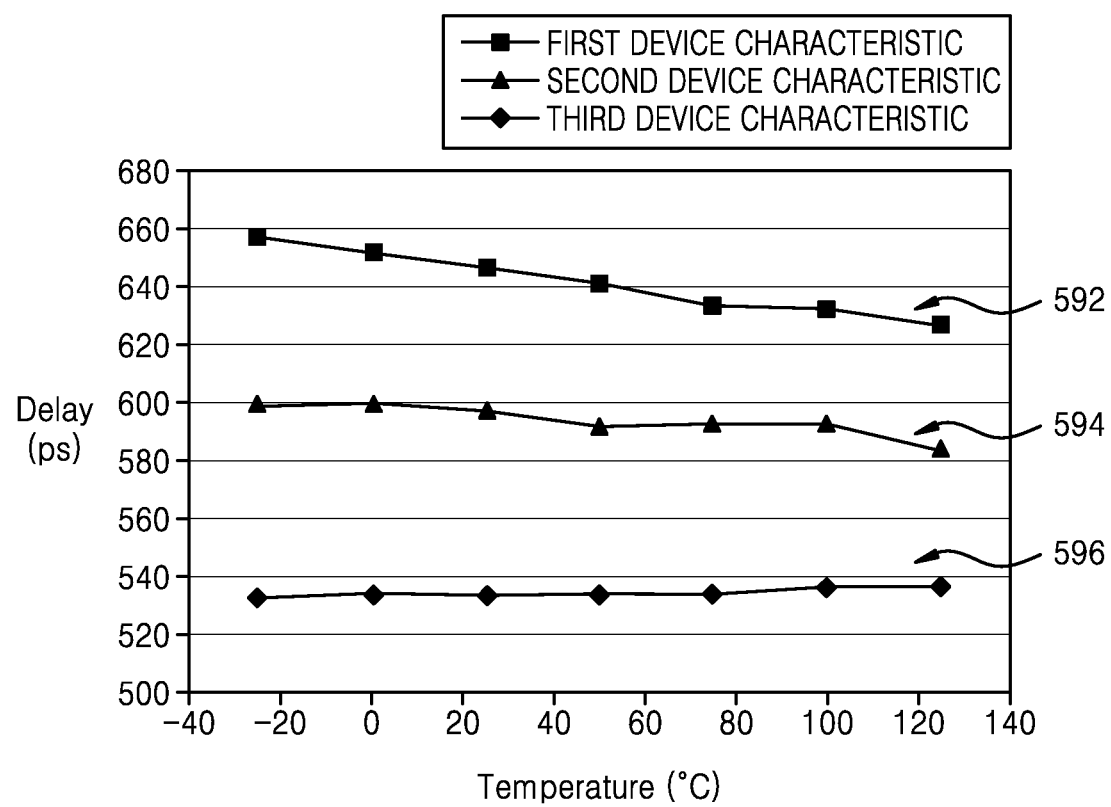
FIG. 5 is a graph illustrating an example of a delay change on the write data strobe signal WDQS path according to temperature characteristics of devices of a memory device, according to an embodiment.

FIG. 5 is a graph illustrating an example of a delay change on a WDQS path WDQS_P according to temperature characteristics of devices of a memory device, according to an embodiment.

Referring to FIG. 5, the horizontal axis represent temperature values, and the vertical axis may represent a delay on the WDQS path WDQS_P in picoseconds (ps). Referring to FIGS. 2 and 5, a delay variation on the WDQS path WDQS_P according to a temperature change may vary depending on the device characteristics of the WDQS transfer circuit 410. As used herein, the delay variation on the WDQS path WDQS_P according to the temperature change may refer to the delay variation TD described with reference to FIGS. 3 and 4. The device characteristics may be distinguished by process corners of devices (e.g., transistors) on the WDQS path WDQS_P. For example, the device characteristics may be divided into a slow process corner, a typical process corner, and a fast process corner.

When the devices of the WDQS transfer circuit 410 have a first device characteristic 592 (e.g., when the devices of the WDQS transfer circuit 410 correspond to the slow process corner), as the temperature of the memory system 20 increases, the delay on the WDQS path WDQS_P may be reduced.

When the devices of the WDQS transfer circuit 410 have a second device characteristic 594 (e.g., when the devices of the WDQS transfer circuit 410 correspond to the typical process corner), as the temperature of the memory system 20 increases, the delay on the WDQS path WDQS_P may be reduced. As shown in FIG. 5, a delay reduction amount corresponding to the second device characteristic 594 may be smaller than a delay reduction amount corresponding to the first device characteristic 592.

When the devices of the WDQS transfer circuit 410 have a third device characteristic 596 (e.g., when the devices of the WDQS transfer circuit 410 correspond to the fast process corner), as the temperature of the memory system 20 increases, the delay on the WDQS path WDQS_P may be increased.

As shown in FIG. 5, the delay on the WDQS path WDQS_P according to the device characteristics of the WDQS transfer circuit 410 may change linearly (and/or substantially linearly) according to the temperature change. Accordingly, a coefficient code reflecting the device characteristics may be calculated based on delay values on the WDQS path WDQS_P corresponding to a current temperature. For example, the coefficient code may be calculated as an inclination of a delay change according to the temperature. That is, when the memory device 400 compensates for the delay change by using the coefficient code calculated based on the delay values of the temperature, temperature compensation in which the device characteristics are reflected may be performed.

Figure 6:
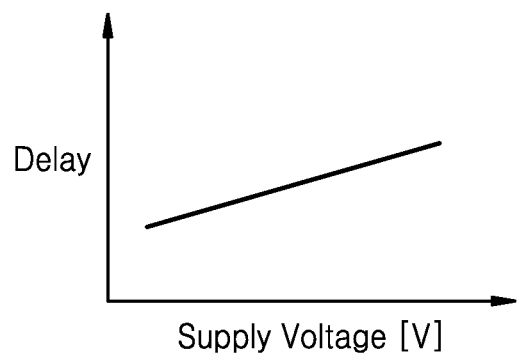
FIG. 6 is a graph illustrating an example of a delay change on the write data strobe signal WDQS path according to supply voltage characteristics of devices of a memory device, according to an embodiment.

FIG. 6 is a graph illustrating an example of a delay change on a WDQS path WDQS_P according to supply voltage characteristics of devices of a memory device, according to an embodiment.

In FIG. 6, the horizontal axis may represent a supply voltage, and the vertical axis may represent a delay on the WDQS path WDQS_P.

Referring to FIGS. 2 and 6, a delay variation on the WDQS path WDQS_P according to a supply voltage change may vary depending on the device characteristics of the WDQS transfer circuit 410. As used herein, the delay variation on the WDQS path WDQS_P according to the supply voltage change may refer to the delay variation VD described with reference to FIGS. 3 and 4. Consequently, as the supply voltage increases, the delay variation may increase.

As shown in FIG. 6, the delay on the WDQS path WDQS_P according to the device characteristics of the WDQS transfer circuit 410 may change linearly (and/or substantially linearly) according to the supply voltage change. Accordingly, a coefficient code reflecting the device characteristics may be calculated based on delay values on the WDQS path WDQS_P corresponding to the supply voltage. For example, the coefficient code may be calculated as an inclination of the delay change according to the voltage. That is, when the memory device 400 compensates for the delay change by using the coefficient code calculated based on the delay values of the voltage, temperature compensation in which the device characteristics are reflected may be performed.

FIG. 7 is a table of an operation of the monitoring circuit 530 of FIG. 3, according to an embodiment.

Referring to FIGS. 3 and 7, the monitoring circuit 530 may compare a current temperature with a reference temperature to calculate the temperature code TCODE, which is a temperature change. For example, the reference temperature may be previously stored in the monitoring circuit 530.

The monitoring circuit 530 may monitor the temperature code TCODE and the coefficient code CCODE.

As shown in FIGS. 3 and 7, the monitoring circuit 530 may output a first coefficient code CCODE1 in correspondence to a first temperature code TCODE1, may output a second coefficient code CCODE2 in correspondence to a second temperature code TCODE2, and may output an n-th coefficient code CCODEn in correspondence to an n-th temperature code TCODEn.

That is, the coefficient code CCODE may reflect device characteristics of a WDQS transfer circuit.

Figure 8:
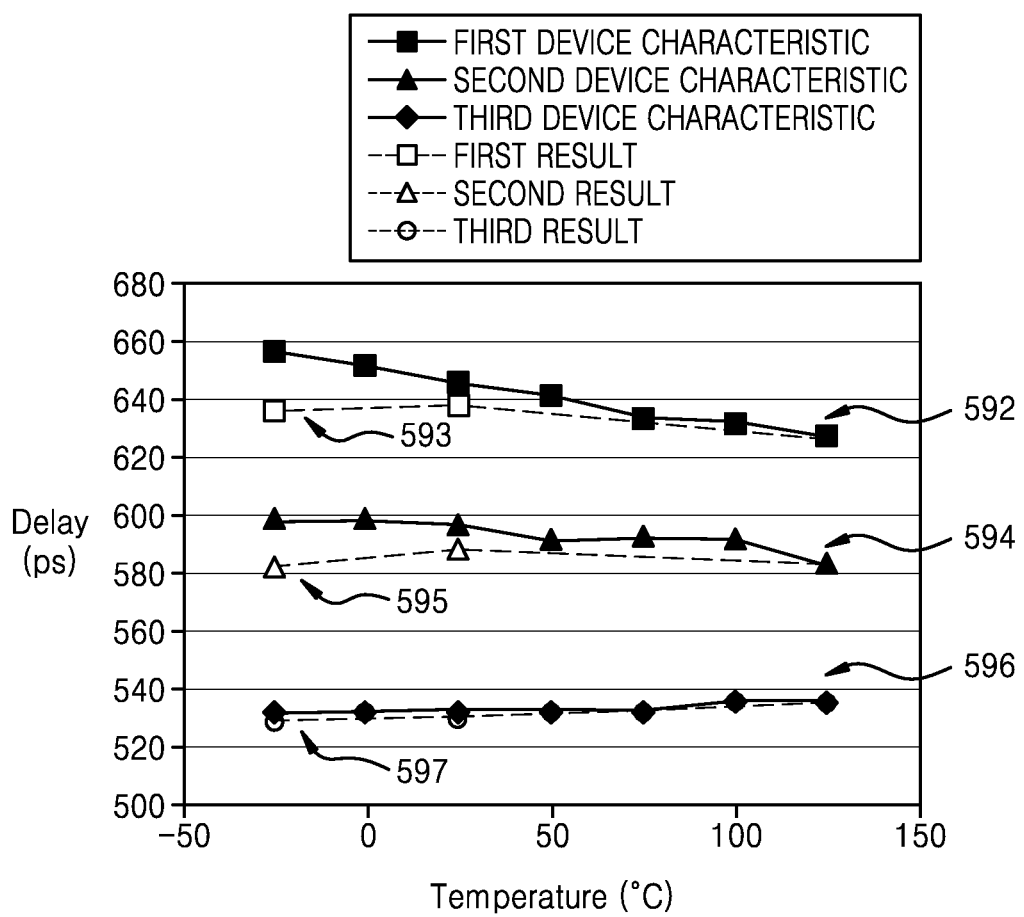
FIG. 8 is a graph illustrating results of temperature compensation, according to an embodiment.

FIG. 8 is a graph illustrating results according to temperature compensation, according to an embodiment.

The first to third device characteristics 592 to 596 of FIG. 8 may be similar in many respects to the first to third device characteristics 592 to 596 described with reference to FIG. 5. Consequently, repeated descriptions of the first to third device characteristics 592 to 596 of FIG. 8 described above with reference to FIG. 5 may be omitted for the sake of brevity.

Referring to FIGS. 5 and 8, a delay reduction amount of a first result 593 may be smaller than a delay reduction amount of a first device characteristic 592.

In an embodiment, the delay reduction amount of a second result 595 may be smaller than a delay reduction amount of a second device characteristic 594.

In an optional or additional embodiment, a delay reduction amount of a third result 597 may be smaller than a delay reduction amount of a third device characteristic 596.

According to some embodiments, a delay on a data clock path may be regulated according to a temperature change sensed in real time in consideration of characteristics of circuits on the data clock path. That is, a delay change on the data clock path according to a temperature change may be compensated for without retraining the data clock signal. Accordingly, an S/H margin for sampling a data signal may be improved regardless of the temperature change, and data errors may be reduced.

Figure 9:
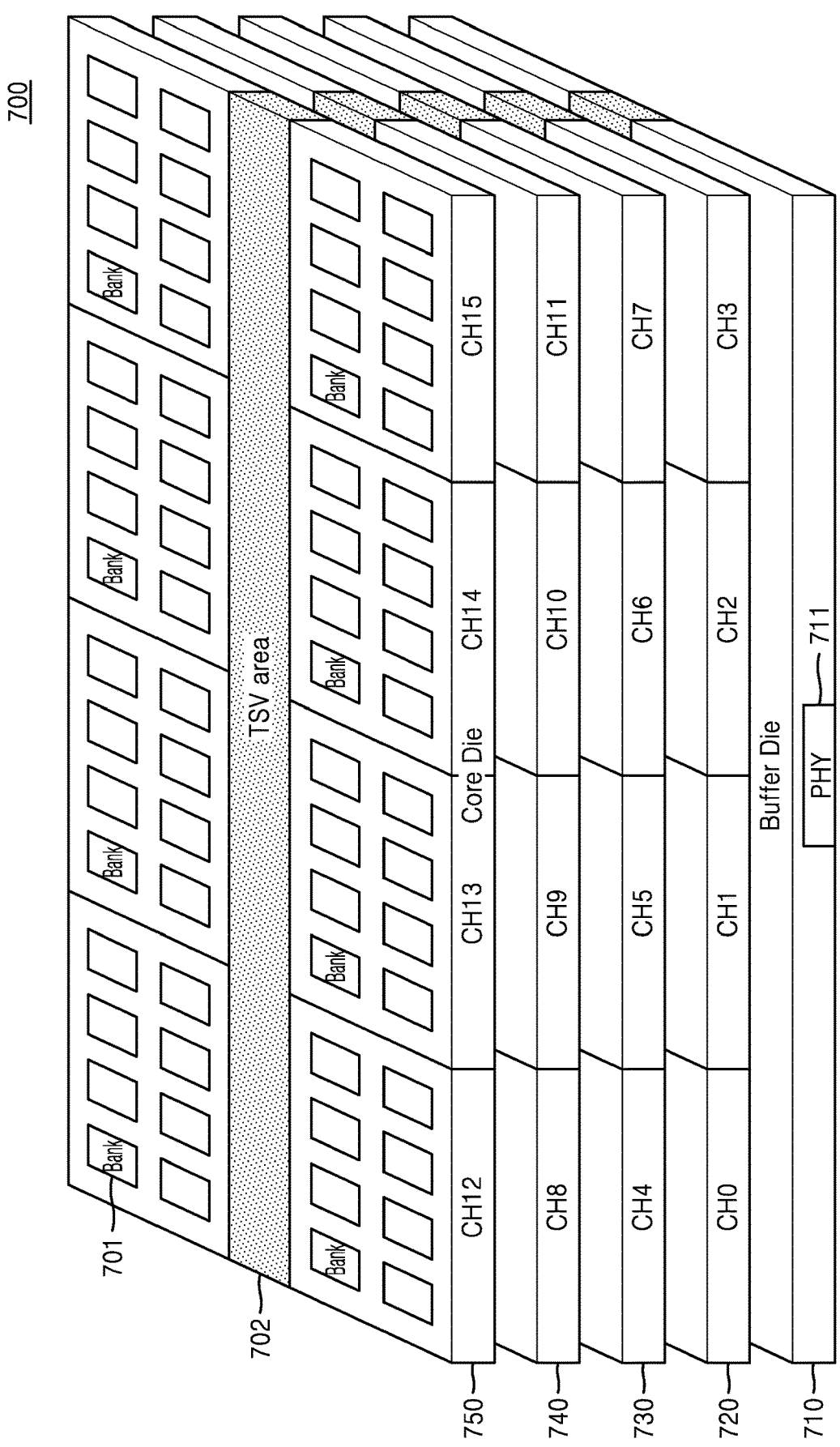
FIG. 9 is a block diagram illustrating a stacked memory device, according to an embodiment.

FIG. 9 is a diagram illustrating a stacked memory device, according to an embodiment.

Referring to FIG. 9, a stacked memory device 700 may include and/or may be similar in many respects to at least one of the memory device 200, the memory device 400, and the memory device 500 described with reference to FIGS. 1 to 8, and may include additional features not mentioned above. Consequently, repeated descriptions of the stacked memory device 700 described above with reference to FIGS. 1 to 8 may be omitted for the sake of brevity.

The stacked memory device 700 may include a buffer die 710 and a plurality of core dies 720 to 750. For example, the buffer die 710 may also be referred to as an interface die, a base die, a logic die, a master die, and the like. Alternatively or additionally, each of the core dies 720 to 750 may be referred to as a memory die, a slave die, and the like. The stacked memory device 700 shown in FIG. 9 includes the four core dies 720 to 750. However, the present disclosure is not limited in this regard. That is, the number of core dies may be changed in various ways. For example, the stacked memory device 700 may include 8, 12, and/or 16 core dies.

The buffer die 710 and the core dies 720 to 750 may be stacked and electrically connected to each other via through silicon vias (TSVs). Accordingly, the stacked memory device 700 may have a three-dimensional (3D) memory structure in which the plurality of dies 710 to 750 are stacked. For example, the stacked memory device 700 may be implemented based on a high bandwidth memory (HBM) and/or a hybrid memory cube (HMC) standard.

The stacked memory device 700 may support a plurality of functionally independent channels (and/or vaults). For example, as shown in FIG. 9, the stacked memory device 700 may support 16 channels CH0 to CH15. When each of the channels CH0 to CH15 supports 64 data transfer paths (e.g., when 64 data signal DQ pins exist respectively corresponding to the channels CH0 to CH15), the stacked memory device 700 including the 16 channels CH0 to CH15 may support 1024 data transfer paths. However, the present disclosure is not limited thereto, and the stacked memory device 700 may support 1024 or more data transfer paths and may support various numbers of channels (e.g., eight (8) channels). For example, when the stacked memory device 700 supports eight (8) channels and each of the channels supports 128 data transfer paths, the stacked memory device 700 may support 1024 data transfer paths.

Each of the core dies 720 to 750 may support at least one channel. For example, as shown in FIG. 9, the core dies 720 to 750 may respectively support four (4) channels CH0 to CH3, CH4 to CH7, CH8 to CH11, and CH12 to CH15. In such an example, the core dies 720 to 750 may support different channels. However, the present disclosure is not limited thereto, and at least two of the core dies 720 to 750 may support the same channel. For example, when the stacked memory device 700 includes eight (8) core dies, one of four (4) core dies among the eight (8) core dies constituting one stack and one of the other four (4) core dies constituting the other stack may support the same channel. In such an example, the core dies supporting the same channel may be distinguished by a stack ID (SID).

Each of the channels CH0 to CH15 may constitute an independent command and data interface. For example, each of the channels CH0 to CH15 may be independently clocked based on independent timing requirements and may not be synchronized with each other.

Each of the channels CH0 to CH15 may include a plurality of memory banks 701. Each of the memory banks 701 may include memory cells connected to word lines and bit lines, sense amplifiers, and the like. For example, each of the channels CH0 to CH15 may include memory banks 701 (e.g., 32 memory banks). However, the present disclosure is not limited thereto, and each of the channels CH0 to CH15 may include eight (8) or more memory banks 701. The memory banks 701 included in one channel are shown as being included in one core die in FIG. 9, however, the memory banks 701 included in one channel may be distributed over a plurality of core dies. For example, when two core dies among the core dies support the first channel CH0, the memory banks 701 of the first channel CH0 may be distributed among the two core dies.

In an embodiment, one channel may be divided into two independently operating pseudo channels. For example, pseudo channels may share commands and/or clock inputs (e.g., the clock signal CK and/or a clock enable signal CKE) of a channel, but may independently decode and execute commands. For example, when one channel supports 64 data transfer paths, each of the pseudo channels may support 32 data transfer paths. As another example, when one channel includes 32 memory banks 701, each of the pseudo channels may include 16 memory banks 701.

The buffer die 710 and each of the core dies 720 to 750 may include a TSV area 702. TSVs configured to penetrate the core dies 720 to 750 may be disposed in the TSV area 702. The buffer die 710 may transmit and/or receive various signals to and/or from the core dies 720 to 750 through the TSVs. Each of the core dies 720 to 750 may transmit and/or receive signals to and/or from the buffer die 710 and other core dies through the TSVs. That is, signals may be independently transmitted and/or received through corresponding TSVs for each channel. For example, when an external host device (e.g., the memory controller 100 of FIG. 1) transmits a data signal through the first channel CH0 to store data in a memory cell of the first channel CH0, the buffer die 710 may transmit the data signal to the first core die 720 through the TSVs corresponding to the first channel CH0. Accordingly, the data may be stored in the memory cell of the first channel CH0.

In an embodiment, a power voltage VDDQL may be used for signal transmission through the TSVs. The power voltage VDDQL may be lower than the power voltage VDDQ used for overall operations of the buffer die 710. For example, the power voltage VDDQ may have a voltage level of about 1.1 volts (V). As another example, the power voltage VDDQL may have a voltage level of about 0.4 V.

The buffer die 710 may include a physical layer PHY 711. The physical layer PHY 711 may include interface circuits for communication with the external host device. In an embodiment, the physical layer PHY 711 may include an interface circuit corresponding to each of the channels CH0 to CH15. For example, an interface circuit corresponding to one channel may include the elements 210 to 240 of the memory device 200 of FIG. 1. Signals received from the host device through the physical layer PHY 711 may be transferred to the core dies 720 to 750 through the TSVs.

In an embodiment, the buffer die 710 may include a channel controller corresponding to each of the channels CH0 to CH15. The channel controller may manage memory referencing operations of the corresponding channel and may determine timing requirements of the corresponding channel.

In an embodiment, the buffer die 710 may include a plurality of pins for receiving signals from the external host device. As described with reference to FIG. 1, the buffer die 710 may receive the clock signal CK, the command/address signal CA, the write data strobe signal WDQS, and the data signal DQ and transmit the data signal DQ through the plurality of pins.

In an embodiment, the stacked memory device 700 may further include an error correction code (ECC) circuit for detecting and correcting an error in data. For example, in a write operation, the ECC circuit may generate parity bits with respect to data transferred from the host device. In a read operation, the ECC circuit may detect and correct an error in data transferred from one of the core dies 720 to 750 by using the parity bits, and transmit the error-corrected data to the host device.

In an embodiment, as described with reference to FIGS. 1 to 8, the stacked memory device 700 may store a coefficient code for compensating for a delay change on a WDQS path WDQS_P according to a temperature change. For example, the coefficient code may be determined during an initialization process or a test process of the stacked memory device 700. The stacked memory device 700 may regulate a delay on the WDQS path WDQS_P according to a real-time temperature based on the stored coefficient code or the determined coefficient code. Accordingly, even though the temperature of the stacked memory device 700 changes, the stacked memory device 700 may maintain the delay on the WDQS path WDQS_P constant without retraining by the host device. Consequently, an S/H margin for sampling the data signal DQ may be improved regardless of the temperature change, when compared to a related memory device.

Figure 10:
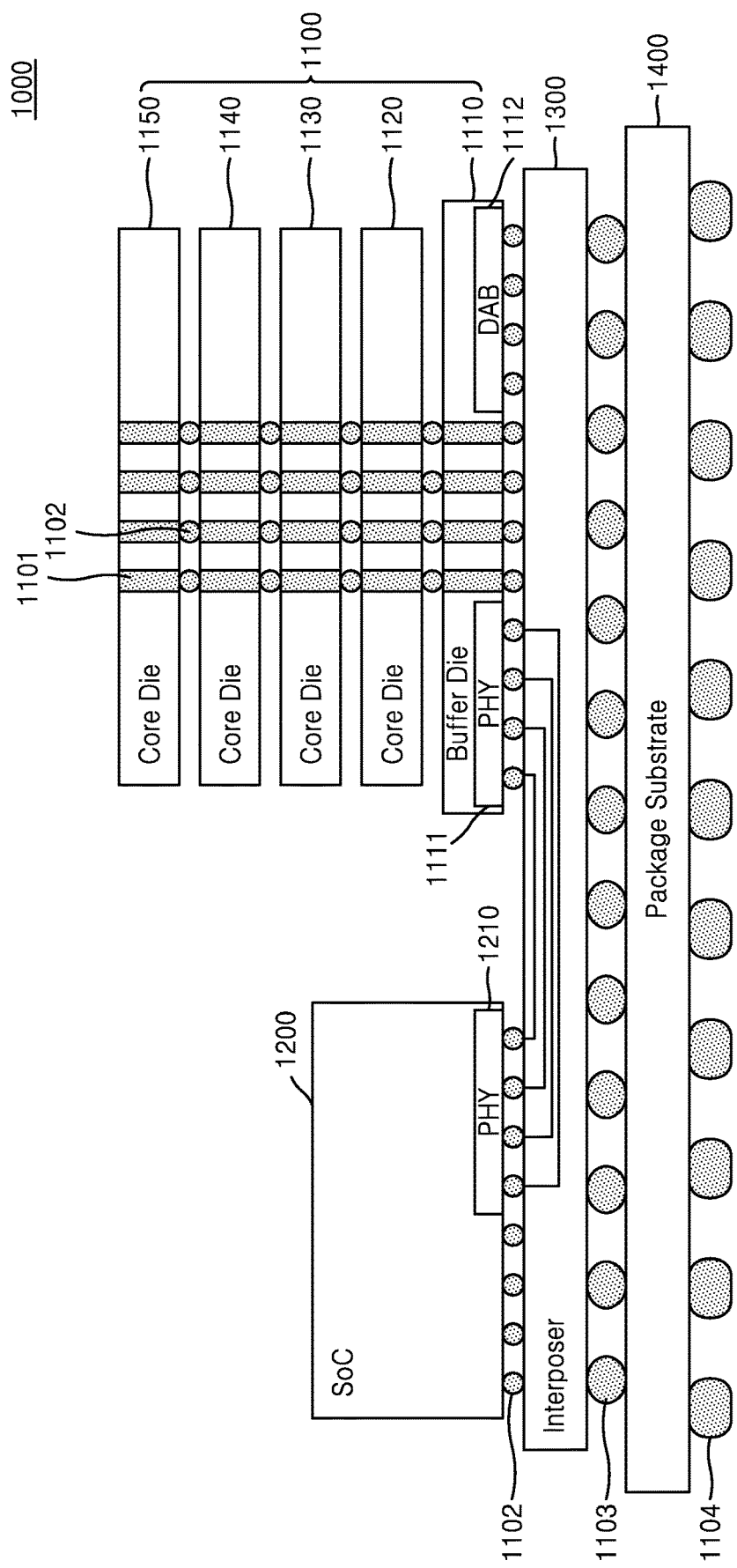
FIG. 10 is a diagram illustrating a semiconductor package, according to an embodiment.

FIG. 10 is a diagram illustrating a semiconductor package, according to an embodiment.

Referring to FIG. 10, a semiconductor package 1000 may include a stacked memory device 1100, a system on chip (SoC) 1200, an interposer 1300, and a package substrate 1400. The stacked memory device 1100 may include a buffer die 1110 and core dies 1120 to 1150. The stacked memory device 1100 may include and/or may be similar in many respects to the stacked memory device 700 described with reference to FIG. 9, and may include additional features not mentioned above. Consequently, repeated descriptions of the stacked memory device 700 described above with reference to FIG. 9 may be omitted for the sake of brevity.

Each of the core dies 1120 to 1150 may include memory cells for storing data. The buffer die 1110 may include a physical layer PHY 1111 and a direct access area DAB 1112. The physical layer PHY 1111 may be electrically connected to a physical layer PHY 1210 of the SoC 1200 through the interposer 1300. The stacked memory device 1100 may receive signals from the SoC 1200 and/or transmit signals to the SoC 1200 through the physical layer PHY 1111. The physical layer PHY 1111 may include and/or may be similar in many respects to elements of the buffer die 710 described with reference to FIG. 9, and may include additional features not mentioned above. Consequently, repeated descriptions of the physical layer PHY 1111 described above with reference to FIG. 9 may be omitted for the sake of brevity.

The direct access area DAB 1112 may provide an access path through which the stacked memory device 1100 may be tested without passing through the SoC 1200. The direct access area DAB 1112 may include conductive means (e.g., ports or pins) for direct communication with an external test device. A test signal received through the direct access area DAB 1112 may be transmitted to the core dies 1120 to 1150 through TSVs 1101. For testing of the core dies 1120 to 1150, data read from the core dies 1120 to 1150 may be transmitted to a test device through the TSVs and the direct access area DAB 1112. Accordingly, a direct access test on the core dies 1120 to 1150 may be performed.

The buffer die 1110 and the core dies 1120 to 1150 may be electrically connected to each other through TSVs 1101 and bumps 1102. The buffer die 1110 may receive signals provided to each channel from the SoC 1200 through the bumps 1102 allocated for each channel. Alternatively or additionally, the buffer die 1110 may transmit signals to the SoC 1200 through the bumps 1102. For example, the bumps 1102 may be micro bumps.

The SoC 1200 may execute applications supported by the semiconductor package 1000 by using the stacked memory device 1100. For example, the SoC 1200 may include, but not be limited to, at least one processor of a CPU, an application processor (AP), a graphics processing unit (GPU), a neural processing unit (NPU), a tensor processing unit (TPU), a vision processing unit (VPU), an image signal processor (ISP), or a digital signal processor (DSP) to perform specialized operations.

The SoC 1200 may control overall operations of the stacked memory device 1100. The SoC 1200 may include and/or may be similar in many respects to at least one of the memory controllers 100 and 300 described above with reference to FIGS. 1 and 2. The system on a chip 1200 may include the physical layer PHY 1210. The physical layer PHY 1210 may include an interface circuit for transmitting and/or receiving signals to and/or from the physical layer PHY 1111 of the stacked memory device 1100. For example, the physical layer PHY 1210 may include and/or may be similar in many respects to elements of at least one of the memory controller 100 of FIG. 1 and the memory controller 300 of FIG. 2. The SoC 1200 may provide various signals to the physical layer PHY 1111 through the physical layer PHY 1210. The signals provided to the physical layer PHY 1111 may be transferred to the core dies 1120 to 1150 through interface circuits and the TSVs 1101 of the physical layer PHY 1111.

The interposer 1300 may connect the stacked memory device 1100 to the SoC 1200. The interposer 1300 may connect between the physical layer PHY 1111 of the stacked memory device 1100 and the physical layer PHY 1210 of the SoC 1200. For example, the interposer 1300 provide physical paths formed using conductive materials. Accordingly, the stacked memory device 1100 and the SoC 1200 may be stacked on the interposer 1300 to transmit/receive signals to and/or from each other.

Bumps 1103 may be attached to an upper portion of the package substrate 1400. Alternatively or additionally, solder balls 1104 may be attached to a lower portion of the package substrate 1400. For example, the bumps 1103 may be flip-chip bumps. The interposer 1300 may be stacked on the package substrate 1400 through the bumps 1103. The semiconductor package 1000 may transmit and/or receive signals to and/or from other external packages and/or semiconductor devices through the solder balls 1104. For example, the package substrate 1400 may be a printed circuit board (PCB).

In an embodiment, the physical layer PHY 1111 of the buffer die 1110 may receive the write data strobe signal WDQS and/or the data signal DQ from the SoC 1200 through the bumps 1102. As described with reference to FIGS. 1 to 9, the physical layer PHY 1111 may sample the data signal DQ based on the write data strobe signal WDQS having a coefficient code which may be a regulated delay.

Figure 11:
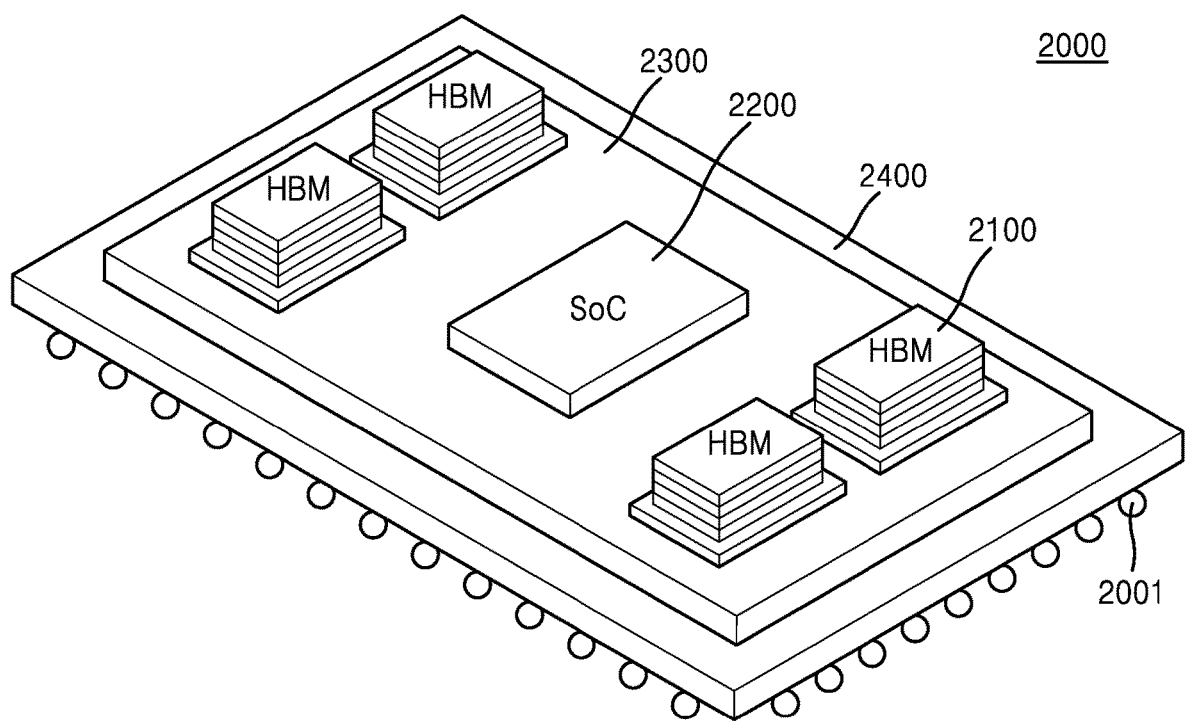
FIG. 11 is a diagram illustrating an implementation example of a semiconductor package, according to an embodiment.

FIG. 11 is a diagram illustrating an implementation example of a semiconductor package, according to an embodiment.

Referring to FIG. 11, a semiconductor package 2000 may include a plurality of stacked memory devices 2100 and a SoC 2200. Each of the stacked memory devices 2100 may include and/or may be similar in many respects to the stacked memory device 1100 of FIG. 10, and may include additional features not mentioned above. The SoC 2200 may include and/or may be similar in many respects to the SoC 1200 of FIG. 10, and may include additional features not mentioned above. The stacked memory devices 2100 and the SoC 2200 may be stacked on an interposer 2300, and the interposer 2300 may be stacked on a package substrate 2400. The semiconductor package 2000 may transmit and/or receive signals to and/or from other external packages and/or semiconductor devices through solder balls 2001 attached to a lower portion of the package substrate 2400.

Each of the stacked memory devices 2100 may be implemented based on the HBM standard, for example. However, the present disclosure is not limited thereto, and each of the stacked memory devices 2100 may be implemented based on a graphics double data rate (GDDR) standard, an HMC standard, and/or a Wide I/O standard.

The SoC 2200 may include at least one processor such as, but not limited to, a CPU, AP, GPU, or NPU. Alternatively or additionally, the SoC 2200 may include a plurality of memory controllers for controlling the plurality of stacked memory devices 2100. That is, the SoC 2200 may transmit and/or receive signals to and/or from the corresponding stacked memory devices 2100 through the plurality of memory controllers.

While the present disclosure has been particularly shown and described with reference to embodiments thereof, it may be understood that various changes in form and details may be made therein without departing from the spirit and scope of the following claims.

What is claimed is:

1. A memory device, comprising:
   a data sampler configured to sample a data signal from a memory controller based on a write data strobe signal from the memory controller;
   a measuring circuit configured to measure a temperature-based delay variation based on a temperature of a transfer path of the write data strobe signal, and to measure a voltage-based delay variation based on a voltage on the transfer path of the write data strobe signal;
   a storage circuit configured to store a first coefficient code regulating a reference-based delay variation on the transfer path of the write data strobe signal based on a temperature change;
   a temperature sensor configured to sense the temperature of the transfer path of the write data strobe signal;
   a monitoring circuit configured to generate a second coefficient code by comparing the sensed temperature, the temperature-based delay variation, the voltage-based delay variation, and the reference-based delay variation with each other;
a reference voltage generator configured to generate a reference voltage from a power voltage based on the second coefficient code;
a voltage regulator configured to generate a regulation voltage based on the reference voltage; and
a write data strobe signal transfer circuit configured to transfer the write data strobe signal to the data sampler by using the regulation voltage.

2. The memory device of claim 1, further comprising:
a first pin configured to receive the data signal from the memory controller; and
a second pin configured to receive the write data strobe signal from the memory controller,
wherein a data signal path corresponding to a first path of the data signal from the first pin to the data sampler is different from the transfer path corresponding to a second path of the write data strobe signal from the second pin to the data sampler.

3. The memory device of claim 1, wherein the write data strobe signal transfer circuit is further configured to:
transfer the write data strobe signal to the data sampler based on a delay corresponding to the second coefficient code.

4. The memory device of claim 1, wherein the write data strobe signal transfer circuit is configured to:
transfer the write data strobe signal to the data sampler by using the regulation voltage.

5. The memory device of claim 1, wherein the monitoring circuit is further configured to:
generate the second coefficient code based on a ratio obtained by dividing the temperature-based delay variation by the voltage-based delay variation matching the reference-based delay variation.

6. The memory device of claim 1, wherein the reference-based delay variation is a temperature variation based on a low dropout (LDO) reference voltage of the memory device.

7. The memory device of claim 6, wherein the monitoring circuit is further configured to:
regulate the reference-based delay variation based on the second coefficient code.

8. The memory device of claim 1, wherein the monitoring circuit is further configured to:
generate the second coefficient code based on a variation of the write data strobe signal and the temperature change of the memory device.

9. The memory device of claim 8, wherein the monitoring circuit is further configured to:
generate the second coefficient code based on a coefficient code enable command from the memory controller.

10. The memory device of claim 1, wherein the memory device further comprises:
a mode register configured to store the second coefficient code based on a mode register set command from the memory controller.

11. An operating method of a memory device, comprising:
sampling a data signal from a memory controller based on a write data strobe signal from the memory controller;
measuring a temperature-based delay variation based on a temperature of a transfer path of the write data strobe signal;
measuring a voltage-based delay variation based on a voltage on the transfer path of the write data strobe signal;
generating a reference-based delay variation based on a first coefficient code and a temperature change of the memory device;
generating a second coefficient code determined by comparing the temperature-based delay variation, the voltage-based delay variation, and the reference-based delay variation with each other; and
sampling the data signal by regulating a delay on the transfer path of the write data strobe signal based on the temperature change of the memory device and the second coefficient code.

12. The operating method of claim 11, wherein the sampling of the data signal comprises:
sensing a temperature of the memory device;
generating, from a power voltage, a reference voltage based on the second coefficient code; and
generating a regulation voltage based on the reference voltage.

13. The operating method of claim 11, wherein the generating of the second coefficient code comprises:
generating the second coefficient code based on a ratio obtained by dividing the temperature-based delay variation by the voltage-based delay variation matching the reference-based delay variation.

14. The operating method of claim 13, further comprising:
controlling the reference-based delay variation by regulating the second coefficient code when the ratio obtained by dividing the temperature-based delay variation by the voltage-based delay variation is different to the reference-based delay variation.

15. The operating method of claim 11, wherein the generating of the reference-based delay variation comprises:
responding to a coefficient code enable command from the memory controller.

16. The operating method of claim 15, wherein:
the reference-based delay variation is a temperature variation based on a reference voltage of the memory device, and
the operating method further comprises regulating the reference-based delay variation based on the second coefficient code.

17. A memory system, comprising:
a memory device configured to monitor a temperature-based delay variation based on a temperature, a voltage-based delay variation based on a voltage, and a reference-based delay variation with respect to a write data strobe signal for sampling a data signal; and
a memory controller configured to determine a first coefficient code for regulating the reference-based delay variation,
wherein the memory device is further configured to:
compare the temperature-based delay variation, the voltage-based delay variation, and the reference-based delay variation with each other;
regulate a delay on a transfer path of the write data strobe signal based on a temperature change of the memory device; and
sample the data signal.

18. The memory system of claim 17, the memory device further comprising:
a data sampler configured to sample the data signal based on the write data strobe signal;
a measuring circuit configured to measure the temperature-based delay variation based on the temperature of the transfer path of the write data strobe signal, and to measure the voltage-based delay variation based on the voltage on the transfer path of the write data strobe signal;

a storage circuit configured to store the first coefficient code for regulating the reference-based delay variation on the transfer path of the write data strobe signal based on a temperature change;

a temperature sensor configured to sense the temperature of the transfer path of the write data strobe signal;

a monitoring circuit configured to generate a second coefficient code by comparing the sensed temperature, the temperature-based delay variation, the voltage-based delay variation, and the reference-based delay variation with each other;

a reference voltage generator configured to generate a reference voltage from a power voltage based on the second coefficient code;

a voltage regulator configured to generate a regulation voltage based on the reference voltage; and a write data strobe signal transfer circuit configured to transfer the write data strobe signal to the data sampler by using the regulation voltage.

19. The memory system of claim 18, wherein the monitoring circuit is further configured to:

generate the second coefficient code based on a ratio obtained by dividing the temperature-based delay variation by the voltage-based delay variation matching the reference-based delay variation.

20. The memory system of claim 18, wherein the memory device comprises:

a mode register configured to store the second coefficient code based on a mode register set command from the memory controller.

* * * * *